United States Patent
Tsuchihashi et al.

[11] Patent Number: 6,109,208
[45] Date of Patent: *Aug. 29, 2000

[54] PLASMA GENERATING APPARATUS WITH MULTIPLE MICROWAVE INTRODUCING MEANS

[75] Inventors: Masaaki Tsuchihashi; Minoru Hanazaki; Toshio Komemura; Mutumi Tuda; Kouichi Ono; Kouji Oku; Shinji Nakaguma, all of Hyogo, Japan

[73] Assignees: Mitsubishi Denki Kabushiki Kaisha; Mitsubishi Electric Engineering Company Limited, both of Tokyo, Japan

[*] Notice: This patent is subject to a terminal disclaimer.

[21] Appl. No.: 09/122,061

[22] Filed: Jul. 27, 1998

[30] Foreign Application Priority Data

Jan. 29, 1998 [JP] Japan .................. 10-017226

[51] Int. Cl.[7] .............. C23C 16/511; C23C 14/00; C23C 16/00; C23F 1/02
[52] U.S. Cl. .............. 118/723 MA; 118/723 MW; 156/345; 204/298.38; 204/298.08
[58] Field of Search .............. 204/298.38, 298.02, 204/298.08, 298.16; 118/723 MP, 723 MW, 723 ME, 723 MR, 723 MA; 156/345

[56] References Cited

U.S. PATENT DOCUMENTS

| | | | |
|---|---|---|---|
| 4,265,730 | 5/1981 | Hirose et al. | 204/298.38 |
| 5,053,678 | 10/1991 | Koike et al. | 204/298.38 |
| 5,134,965 | 8/1992 | Tokuda et al. | 204/298.38 |
| 5,202,095 | 4/1993 | Houchin et al. | 204/298.38 |
| 5,387,288 | 2/1995 | Shatas | 118/723 MW |
| 5,429,070 | 7/1995 | Campbell et al. | 204/298.38 |
| 5,874,706 | 2/1999 | Ishii et al. | 204/298.38 |

FOREIGN PATENT DOCUMENTS

| | | | |
|---|---|---|---|
| 3-191068 | 12/1989 | Japan | 118/723 MW |
| 4-048078 | 2/1992 | Japan . | |
| 4-048928 | 2/1992 | Japan . | |
| 4-144922 | 5/1992 | Japan | 118/723 MW |
| 6-104188 | 4/1994 | Japan . | |
| 6-349596 | 12/1994 | Japan . | |

*Primary Examiner*—Nam Nguyen
*Assistant Examiner*—Gregg Cantelmo
*Attorney, Agent, or Firm*—McDermott, Will & Emery

[57] ABSTRACT

A plasma generating apparatus capable of improving the uniformity of a plasma processing and coping with a larger diameter of a substrate is obtained. Microwaves are distributed and emitted from a waveguide through the branching portions of a T branch to four rod antennas. The microwaves are introduced through four dielectric tubes into a vacuum vessel. In the vacuum vessel, a multi-cusp magnetic field and an electron cyclotron resonance region are caused by permanent magnets located around the vessel and, by an interaction between a vibrational electric field of the microwaves and a magnetic field, highly uniform plasma is generated in a region where a substrate or the like is subjected to a plasma processing.

8 Claims, 10 Drawing Sheets

PLASMA GENERATING APPARATUS WITH MULTIPLE MICROWAVE INTRODUCING MEANS

CROSS-REFERENCE TO RELATED APPLICATION

This application is related to co-pending application of U.S. Ser. No. 09/031,706, filed Feb. 27, 1998, now U.S. Pat. No. 6,054,016, issued Apr. 25, 2000, commonly assigned to the same applicant.

BACKGROUND OF THE INVENTION

1. Field of the Invention

The present invention relates to a plasma generating apparatus and more particularly to a plasma generating apparatus for performing processings such as reforming, etching, ashing, cleaning and thin film formation at the surfaces of a semiconductor substrate, a liquid crystal glass substrate, an organic material, a metallic material or the like by using generated plasma.

2. Description of the Background Art

Plasma generating apparatuses for generating plasma by the electromagnetic energy of surface waves which are excited and propagated at a boundary of plasma and a surface of a dielectric used for introducing microwaves into a vacuum vessel have been used as a plasma generating apparatus using microwaves. A conventional plasma generating apparatus will be described below with reference to FIGS. 21–24.

As shown in FIG. 21, a surface wave plasma generating apparatus mainly used as a conventional plasma generating apparatus includes a vacuum vessel 101, a microwave oscillator 102, a driving power supply 103, a waveguide 105 and a dielectric plate 120. Vacuum vessel 101 has a gas supply port 101a for supplying a gas for discharging electrons (discharge gas) and a gas evacuation port 101b for evacuating the discharge gas which are provided in the vessel. A substrate 107 for various processings is placed on the lower side of the interior of vacuum vessel 101. on the upper side of the interior of vacuum vessel 101 are provided with a slit 106 and a dielectric plate 120 placed immediately thereunder and formed of a dielectric material. Dielectric plate 120 is connected to waveguide 105. Waveguide 105 is connected to microwave oscillator 102. Further, microwave oscillator 102 is connected to driving power supply 103.

The operation of the conventional surface wave plasma generating apparatus having the structure above will be described. First, a high vacuum pump (not shown) such as a roughing pump and a turbo-molecular pump connected to evacuation port 101b evacuates vacuum vessel 101 to a high vacuum, and a discharge gas such as argon, hydrogen, oxygen, chloride, carbon tetrafluoride and silane is supplied through gas supply port 101a. Thus, the interior of vacuum vessel 101 comes to have a prescribed pressure by the discharge gas. Then, microwave oscillator 102 oscillates microwaves by driving of driving power supply 103. The microwaves are emitted to waveguide 105. The microwaves pass through waveguide 105 and they are emitted from a microwave transmission circuit through slit 106. The emitted microwaves pass through dielectric plate 120 located on an upper surface of vacuum vessel 101 and they are introduced into vacuum vessel 101. Accordingly, plasma 108 is generated inside vacuum vessel 101.

When the density of plasma 108 increases after generation of plasma 108, the microwaves cannot progress into plasma 108. Therefore, they become surface waves generated on a surface of plasma 108 and they are guided in this form. The surface waves propagate along a boundary between dielectric plate 120 and plasma 108. The microwaves are absorbed by plasma 108 being propagated. As a result, in the vicinity of the surface of dielectric plate 120, electrons are accelerated by the vibrational electric field of the surface waves, attaining a high-energy state. The generated plasma 108 of high density is thus dispersed.

However, since dielectric plate 120 is located only on the upper side of vacuum vessel 101 in the conventional plasma generating apparatus as shown in FIG. 21, there caused a difference in microwave introduction between the portions near and remote from dielectric plate 120. It causes electrons and ions in plasma 108 to recombine together when dispersed. Thus, the distribution of the density of plasma 108 is made non-uniform in vacuum vessel 101. As a result, a processing of substrate 107 is also made non-uniform. When vacuum vessel 101 is to be enlarged as the diameter of substrate 107 becomes larger, electrons and ions in plasma 108 are also easily recombined together, the distribution of plasma 108 cannot be kept uniform, and the processing of substrate 107 tends to be non-uniform. This may affect the function of a semiconductor device, preventing the larger diameter of substrate 107.

In order to solve the problems above, the inventors proposed a plasma generating apparatus in which a dielectric tube 110 is inserted into vacuum vessel 101, as shown in FIGS. 22 and 23, as described in the co-pending application of U.S. Ser. No. 09/031,706, filed Feb. 27, 1998 now U.S. Pat. No. 6,054,016.

In the plasma generating apparatus, the vacuum vessel is of a column shape and dielectric tube 110 is arranged in the height direction. This allows uniform introduction of the microwaves in the height direction. The microwaves and a multi-cusp magnetic field 113 generated from magnets 111 shown in FIG. 24 serve to generate and maintain the plasma. It is therefore possible to allow a sufficiently uniform distribution of plasma 108 in the height direction of the column-shaped vacuum vessel.

However, since the apparatus shown in FIG. 22 has only one antenna 109 and one dielectric tube 110, microwave energy hardly reaches near a wall of vacuum vessel 101. Plasma 108 tends to disappear near the wall of vacuum vessel 101. Therefore, the distribution of plasma 108 in the diameter direction of column-shaped vacuum vessel 101 is not sufficiently uniform, and plasma 108 which is completely uniform cannot be generated.

SUMMARY OF THE INVENTION

An object of the present invention is to improve the above mentioned co-pending application of U.S. Ser. No. 09/031,706, filed Feb. 27, 1998, now U.S. Pat. No. 6,054,016 and to provide a plasma generating apparatus capable of generating highly uniform plasma in both of the height direction and the diameter direction and stably supplying and maintaining the plasma of high density in a wide range.

A plasma generating apparatus according to one aspect of the present invention for achieving the object described above includes a microwave generating portion for generating microwaves, a microwave transmitting portion for guiding the microwaves generated by the microwave generating portion, a vacuum vessel connected to the microwave transmitting portion and having a portion for supplying a discharge gas and a vacuum evacuation portion, a microwave emitting portion for emitting the microwaves guided from the microwave transmitting portion into the vacuum vessel, and a microwave introducing portion for introducing the microwaves emitted by the microwave emitting portion into the vacuum vessel, for generating plasma in a prescribed region including a plasma processing region in the vacuum vessel, the microwave emitting portion including a portion for emitting the microwaves for a plurality of locations in the vacuum vessel, and the microwave introducing portion including a portion for introducing the microwaves emitted from the microwave emitting portion to a plurality of parallel locations on the plasma processing region in the vacuum vessel.

By thus structuring the plasma generating apparatus according to the present invention, the microwave emitting portion includes a portion for emitting the microwaves to a plurality of locations parallel to the direction along the plasma processing region in the vacuum vessel, so that the microwaves are emitted for the plurality of locations on the plasma processing region and plasma is generated at the plurality of locations. Therefore, plasma having a more uniform density distribution in the direction along the plasma processing region can be generated than when the microwaves are emitted for only one location as in the prior art. Thus, the uniformity of a plasma-processing in the plasma processing region is improved, and a plasma generating apparatus can be provided which can cope with a larger diameter of a substrate as an object for the plasma processing.

Although a waveguide is mainly used as a microwave transmitting portion, it may be replaced by a flexible member such as a coaxial cable or a corrugated tube according to the degree of microwave power in order to simplify the structure of the plasma generating apparatus.

The microwave introducing portion may be structured by arranging a plurality of tube-shaped or rod-shaped dielectric members in parallel and inserting their respective ends into the vacuum vessel. According to this structure, a plurality of tube-shaped or rod-shaped dielectric members are arranged in parallel and inserted into the vacuum vessel, and microwave power from the microwave generating portion is dispersively introduced into the vacuum vessel. Therefore, a load on each dielectric member is reduced.

The microwave emitting portion may be a plurality of antennas each having one end coupled to the microwave transmitting portion and the other end inserted into each dielectric member. By inserting the ends of the antennas deep into the vacuum vessel, the location for emitting the microwaves is brought closer to a prescribed-plasma processing region, which easily increases the density of plasma in the plasma processing region. When a plurality of slits are provided instead of the antennas as the microwave emitting portion in a preferred embodiment, such an advantage is not achieved. However, it has a similar advantage in that the uniformity of the plasma density distribution in the plasma processing region is improved compared with a conventional plasma generating apparatus having one slit.

In a preferred embodiment of the plasma generating apparatus having a structure described above, a driving portion may further be provided which moves a part of the microwave emitting portion which emits the microwaves into the vacuum vessel in the vacuum vessel. According to the structure, the microwaves can be emitted at a plurality of locations parallel to the direction along a prescribed plasma processing region by using a microwave emitting portion such as an antenna formed of a single member, and the uniformity of the plasma density distribution in the plasma processing region can be improved by the microwave emitting portion having a simpler structure.

In another preferred embodiment of the plasma generating apparatus having a structure described above, a magnetic field generating portion may further be provided which generates a magnetic field in the vacuum vessel. The magnetic generating portion generates a multi-cusp magnetic field in the vicinity of an inner wall of the vacuum vessel, and plasma causes a cyclotron phenomenon by a magnetic mirror effect. Therefore, the plasma exists without colliding with the inner wall of the vacuum vessel. Thus, the generated plasma easily keeps its state. Therefore, the uniformity of the plasma processing in a desired plasma processing region is further improved, and it is also possible to cope with a larger diameter of a substrate as an object for the plasma processing.

Although quartz is typically used as a dielectric material forming the microwave introducing portion, other dielectric materials may also be applied. A preferable example is a dielectric material consisting of one or more materials selected from the group of high molecular materials such as quartz, Pyrex glass and Teflon, and ceramics.

In another preferred embodiment of the plasma generating apparatus according to the present invention, the microwave transmitting portion has a microwave distribution portion for distributing the microwaves generated from the microwave generating portion to supply power to the microwave emitting portion, so that the microwaves can be introduced to a plurality of parallel locations on the plasma processing region.

In still another preferred embodiment of the plasma generating apparatus according to the present invention, the microwave emitting portion may include a portion for successively and selectively switching the location for emitting the microwaves among a plurality of locations. By including such a switching portion, the microwave emitting portion can successively emit, in a time-divisional manner, the microwaves for a plurality of locations to which the microwave are emitted. By thus emitting the microwaves, microwaves having limited power generated by one power supply are concentrated and emitted at one location. As a result, the density of plasma generated at the location can be increased. In this case, there is a difference in the density of plasma newly generated at respective locations from the viewpoint of each divided time. However, the plasma once generated does not attenuate soon but it maintains a certain density even when emission of the microwaves is stopped. Therefore, plasma of high density and high uniformity can be generated in a desired plasma producing region.

As the portion for successively and selectively switching the location for emitting the microwaves, the microwave transmitting portion can have a microwave distributing portion for distributing the microwaves generated from the microwave generating portion to supply power to the microwave emitting portion, and the microwave distributing portion can include a switching portion for switching a microwave emitting portion to be supplied with the microwaves among a plurality of microwave emitting portions. As another example of the portion for successively and selectively switching the location for emitting the microwaves, the microwave emitting portion can include a plurality of slits which are opened near one end of the microwave introducing portion, and a shutter for selectively shutting the plurality of slits to switch a slit for emitting the microwaves between the plurality of slits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below with reference to the drawings.

(First Embodiment)

Figure 1:
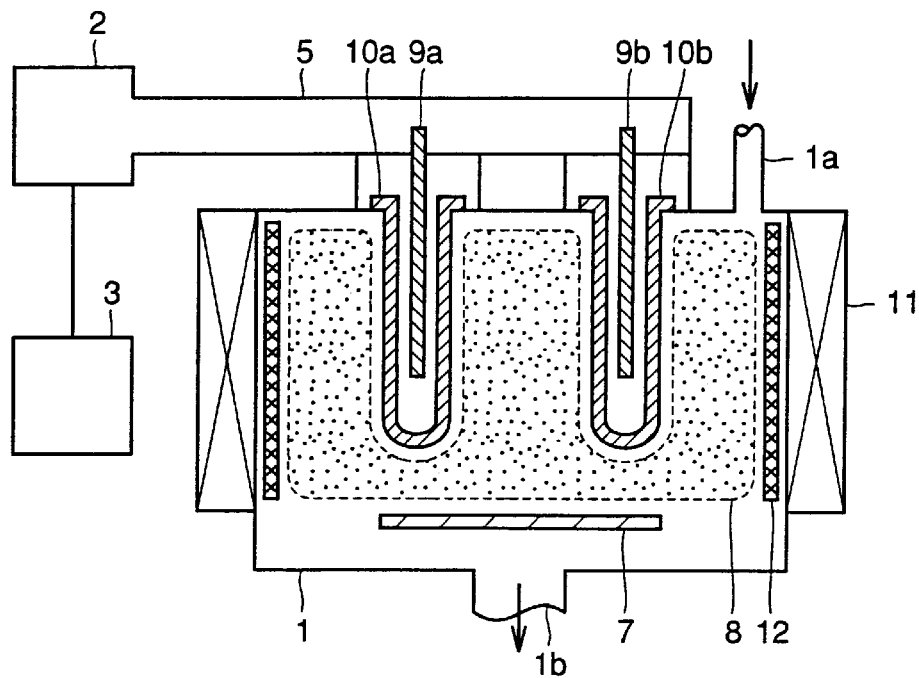
FIG. 1 shows a schematic structure of a plasma generating apparatus according to a first embodiment of the present invention.
Figure 2:
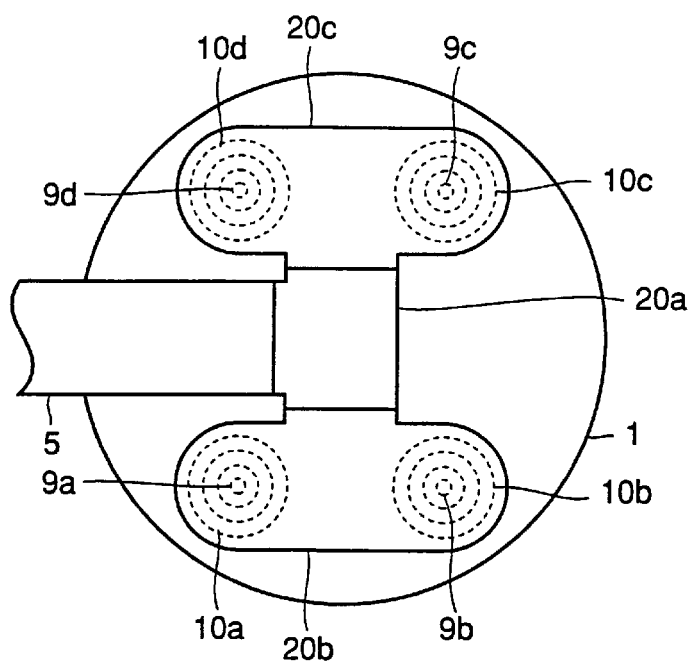
FIG. 2 is a plan view in the neighborhood of a vacuum vessel of the plasma generating apparatus shown in FIG. 1.

A first embodiment of the present invention will be described based on FIGS. 1–3. As shown in FIGS. 1 and 2, a plasma generating apparatus includes a vacuum vessel 1, a microwave oscillator 2, a driving power supply 3 and a waveguide 5. Further, vacuum vessel 1 has a gas supply port 1a for supplying a discharge gas into vacuum vessel 1 and a gas evacuation port 1b for evacuating vacuum vessel 1 to obtain a vacuum state. A substrate 7 to be processed is placed on a lower side of the interior of vacuum vessel 1. On an upper side of the interior of vacuum vessel 1 are provided with four rod antennas 9a, 9b, 9c, 9d and four dielectric tubes 10a, 10b, 10c, 10d in which one end of respective rod antennas 9a, 9b, 9c, 9d are inserted. Dielectric tubes 10a, 10b, 10c, 10d are connected to waveguide 5. Waveguide 5 is connected to microwave oscillator 2. Further, microwave oscillator 2 is connected to driving power supply 3.

Permanent magnets 11 are located around vacuum vessel 1. Permanent magnets 11 generate a cyclotron resonance region 12 where magnetic strength is about 875 G for microwaves having a frequency of 2.45 GHz, for example, in a magnetic field region where the frequency of microwaves coincides with the cyclotron frequency of electrons. Permanent magnets 11 also generate a so-called multi-cusp magnetic field 13 which is a magnetic field generated between a plurality of N and S poles of permanent magnets. The distribution of magnetic fields are as specified by equal magnetic field strength lines 14 for permanent magnet 11. Rod antennas 9a, 9b, 9c, 9d and dielectric tubes 10a, 10b, 10c, 10d for introducing microwaves into vacuum vessel 1 are located inside vacuum vessel 1, and magnetic strength at the microwave introduction portion is within 100 G as shown in FIG. 3. In this structure, plasma 8 is produced in vacuum vessel 1.

As shown in FIG. 2, a T branch having branch portions 20a, 20b, 20c is connected to waveguide 5. Microwaves are distributed from waveguide 5 to rod antennas 9a, 9b, 9c, 9d so that the microwaves are firstly guided to branch portion 20a connected to waveguide 5, secondly branched off in two directions from branch portion 20a toward branch portions 20b and 20c, and thirdly branched off from the both ends of the branching sides of branch portion 20a to branch portions 20b and 20c. Thereafter, the microwaves are guided to rod antennas 9a, 9b, 9c, 9d connected to the both ends of respective branch portions 20b and 20c. The microwaves are thus emitted from rod antennas 9a, 9b, 9c, 9d into vacuum vessel 1. Here, dielectric tubes 10a, 10b, 10c, 10d are made of quartz, they separate the vacuum atmosphere from the atmosphere, and can pass the microwaves to be introduced into vacuum vessel 1.

The operation of the thus structured plasma generating apparatus in this embodiment will be described below.

First, a high vacuum pump (not shown) such as a roughing pump and a turbo-molecular pump connected to evacuation port 1b as in the conventional structure evacuates vacuum vessel 1 to a high vacuum, and a discharge gas such as argon, hydrogen, oxygen, chloride, carbon tetrafluoride and silane is supplied through gas supply port 1a. Thus, the interior of vacuum vessel 1 reaches a prescribed pressure by the discharge gas. Thereafter, microwave oscillator 2 oscillates microwaves by driving of driving power supply 3. The microwaves are guided to waveguide 5. The microwaves pass through waveguide 5 and they are distributed into four directions by branch portions 20a, 20b and 20c. Then, the microwaves which were guided through waveguide 5 are emitted from a microwave transmission circuit by rod antennas 9a, 9b, 9c, 9d coupled to branch portions 20b and 20c. Thereafter, the emitted microwaves pass through dielectric tubes 10a, 10b, 10c, 10d inserted into vacuum vessel 1 and they are introduced into vacuum vessel 1. At this time, in the vicinity of an electron cyclotron resonance region 12 generated by permanent magnets 11, the frequency of the microwaves coincides with the cyclotron frequency of electrons, which causes an electron cyclotron resonance phenomenon in which electrons are resonantly accelerated by the vibrational electric field of the microwaves. Thus, electron cyclotron resonance discharging is easily caused under a low gas pressure in the order of $10^{-4}$ Torr, and plasma 8 is generated in vacuum vessel 1.

Microwave power being introduced is small after plasma 8 is generated. If the density of electrons is lower than a so-called cutoff density of microwaves (about $7 \times 10^{10}$ cm$^{-3}$ in the case of microwaves having a frequency of 2.45 GHz) which is a borderline as to whether microwaves can be introduced into plasma 8 or not, the microwaves introduced into vacuum vessel 1 through dielectric tubes 10a, 10b, 10c, 10d can propagate through plasma 8 and reach electron cyclotron resonance region 12. Therefore, resonated electrons which obtain energy from the electron cyclotron resonance excite, dissociate and electrically dissociate neutral gas particles on atoms or molecules and maintain generation of plasma 8.

If microwave power being introduced is large and the density of electrons in plasma 8 is higher than the cutoff density, the microwaves which were introduced through dielectric tubes 10a, 10b, 10c, 10d into vacuum vessel 1 cannot propagate through plasma 8 and can exist as surface waves propagating only along a boundary between dielectric tubes 10a, 10b, 10c, 10d and plasma 8. Even in the case of plasma of high density in which the density of electrons in plasma 8 exceeds the cutoff density, the excited surface waves propagate along the boundary without being reflected, and the energy is absorbed by plasma 8 during propagation. Therefore, electrons in plasma 8 in the vicinity of the surfaces of dielectric tubes 10a, 10b, 10c, 10d are accelerated by the vibrational electric field of the surface waves and they attain a high-energy state. Thus, they excite, dissociate and electrically dissociate neutral gas particles on atoms or molecules and maintain generation of plasma 8.

Figure 3:
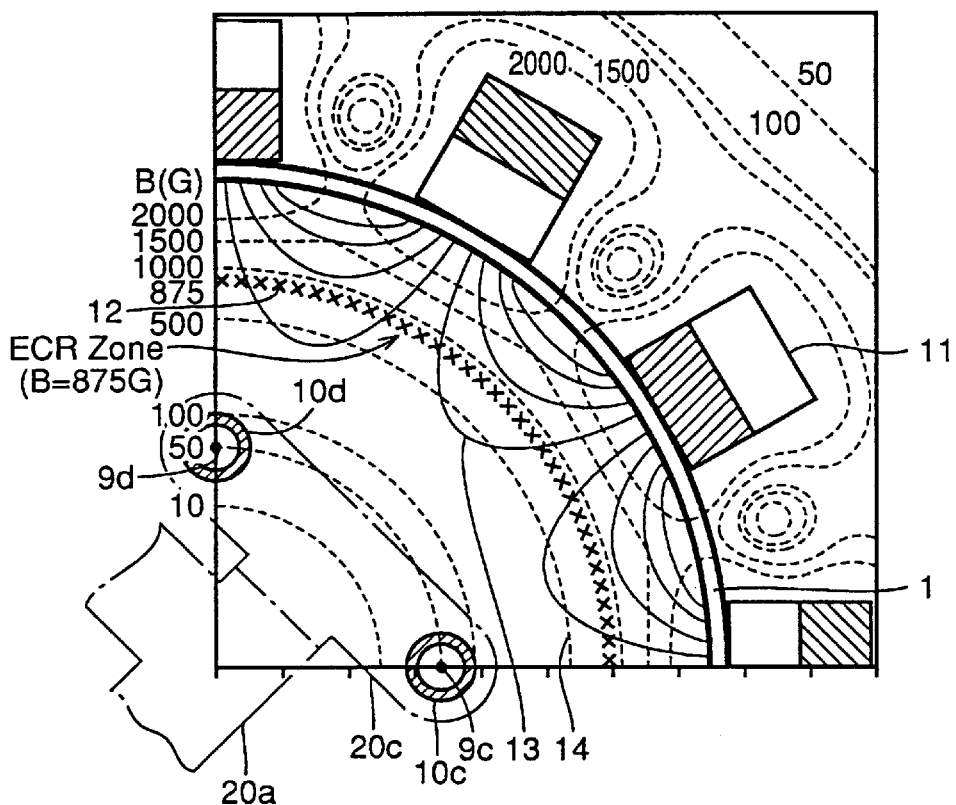
FIG. 3 shows the arrangement of permanent magnets and the distribution of the strength of a generated magnetic field in the first embodiment of the present invention.

As shown in FIG. 3, permanent magnets 11 attached around vacuum vessel 1 form multi-cusp magnetic field 13 in the vicinity of a wall surface of vacuum vessel 1. Multi-cusp magnetic field 13 causes a so-called magnetic mirror effect and acts to confine electrons or ions in plasma 8 to vacuum vessel 1. Especially, multi-cusp-magnetic field 13 can increase a magnetic mirror rate for electrons or ions generated in a low magnetic field region at the center of vacuum vessel 1, providing an extremely strong magnetic confinement effect. By the effect of multi-cusp magnetic field 13, the loss of plasma 8 in the recombination process on the wall surface of vacuum vessel 1 can be suppressed and generated plasma 8 can easily be maintained.

Since rod antennas 9a, 9b, 9c, 9d and dielectric tubes 10a, 10b, 10c, 10d for introducing the microwaves into vacuum vessel 1 are located in the low magnetic field region, the magnetic mirror rate can be increased for electrons or ions generated by the power of the surface waves which are excited and propagated at the boundary of dielectric tubes 10a, 10b, 10c, 10d and plasma 8. Thus, the magnetic confinement effect which acts on the charged particles is significantly strong.

Figure 22:
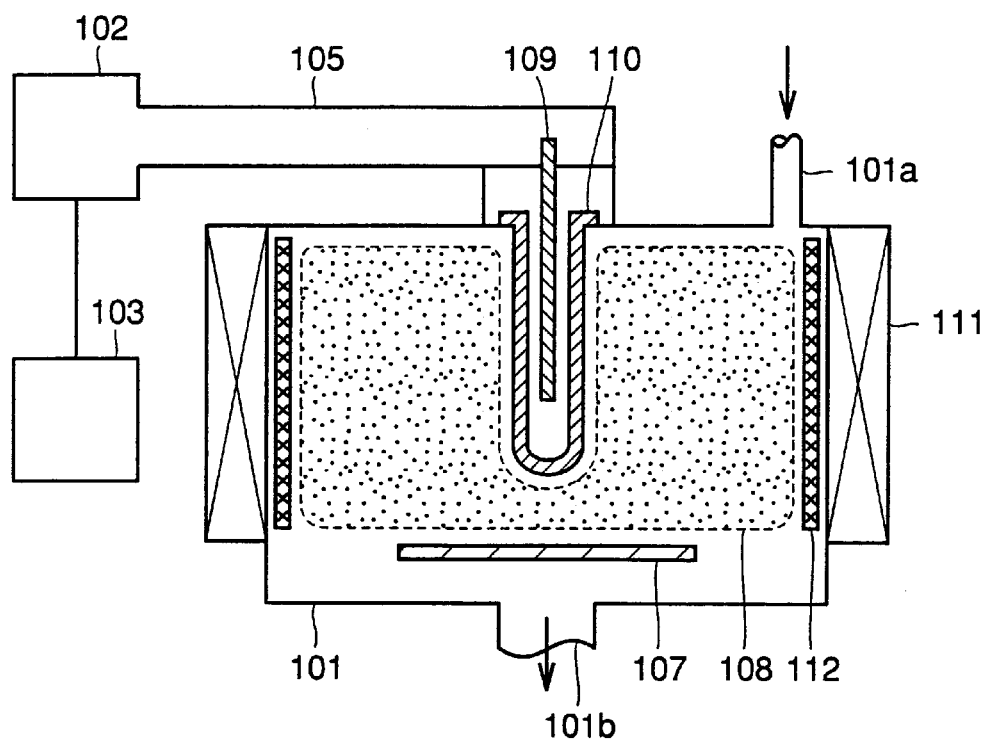
FIG. 22 shows a schematic structure of the plasma generating apparatus proposed by the inventors in the above described co-pending application of U.S. Ser. No. 09/031,706, filed Feb. 27, 1998, now U.S. Pat. No. 6,054,016.
Figure 23:
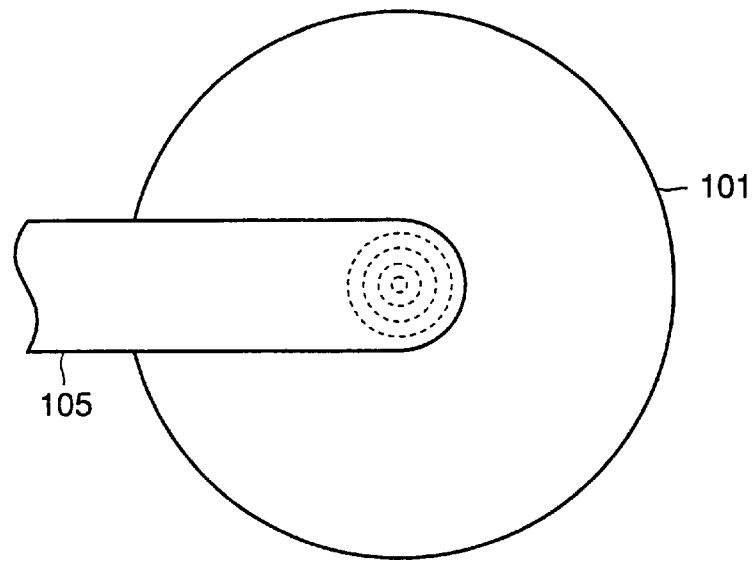
FIG. 23 is a plan view in the neighborhood of a vacuum vessel of the plasma generating apparatus shown in FIG. 21.
Figure 24:
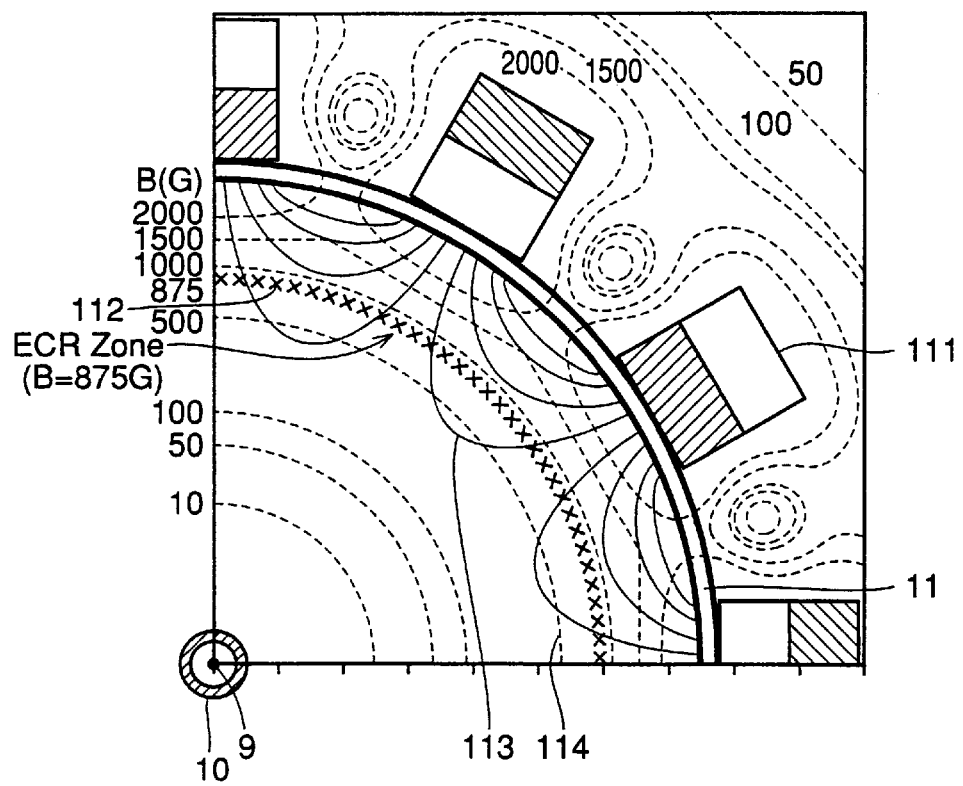
FIG. 24 shows the arrangement of permanent magnets and the distribution of the strength of a generated magnetic field in the plasma generating apparatus shown in FIG. 21.

In other words, by the combination of generation of plasma 8 due to excitement of the surface waves in the low magnetic field region and confinement of the plasma by multi-cusp magnetic field 13, plasma 8 of high density which exceeds the cutoff density can be produced efficiently even under a low gas pressure in the order of $10^{-4}$ Torr. Conventionally, rod antenna 109 and dielectric tube 110 have been provided to introduce microwave power into vacuum vessel 101 from one location as shown in FIG. 22. In this embodiment, however, rod antennas 9a, 9b, 9c, 9d and dielectric tubes 10a, 10b, 10c, 10d introduce microwave power to the low magnetic field region in vacuum vessel 1 from four locations. Thus, microwaves are supplied into vacuum vessel 1 from dielectric tubes 10a, 10b, 10c, 10d at four locations which are disposed as a whole compared with the case of one location. Thus, the microwaves are dispersed and uniformly supplied in the height direction and the diameter direction. Therefore, the uniformity of the plasma density is improved, suppressing decrease of the plasma density which is caused by recombination of electrons and ions in plasma 8 dispersing in the diameter direction. In this embodiment, a uniform processing is thus made possible for substrate 7 provided in vacuum vessel 1. When a semiconductor device is provided on substrate 7 and thin film formation, for example, by the plasma CVD method is performed the processing can be performed with a uniform plasma distribution. Thus, improvement in yield can be expected.

Although quartz is used as a dielectric material in this embodiment, uniform plasma generation is allowed even if quartz is replaced by one or more materials selected from the group of high molecular materials such as Pyrex glass and Teflon, and ceramics.

Figure 4:
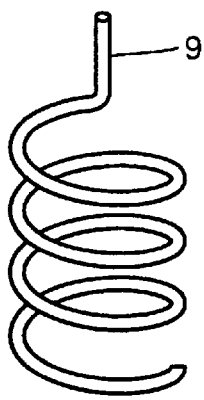
FIG. 4 shows one variation of an antenna of the plasma generating apparatus according to the first embodiment of the present invention.
Figure 5:
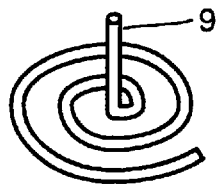
FIG. 5 shows another variation of an antenna of the plasma generating apparatus according to the first embodiment of the present invention.
Figure 6:
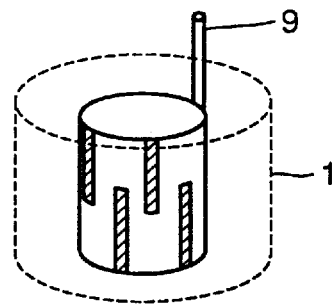
FIG. 6 shows still another variation of an antenna of the plasma generating apparatus according to the first embodiment of the present invention.
Figure 7:
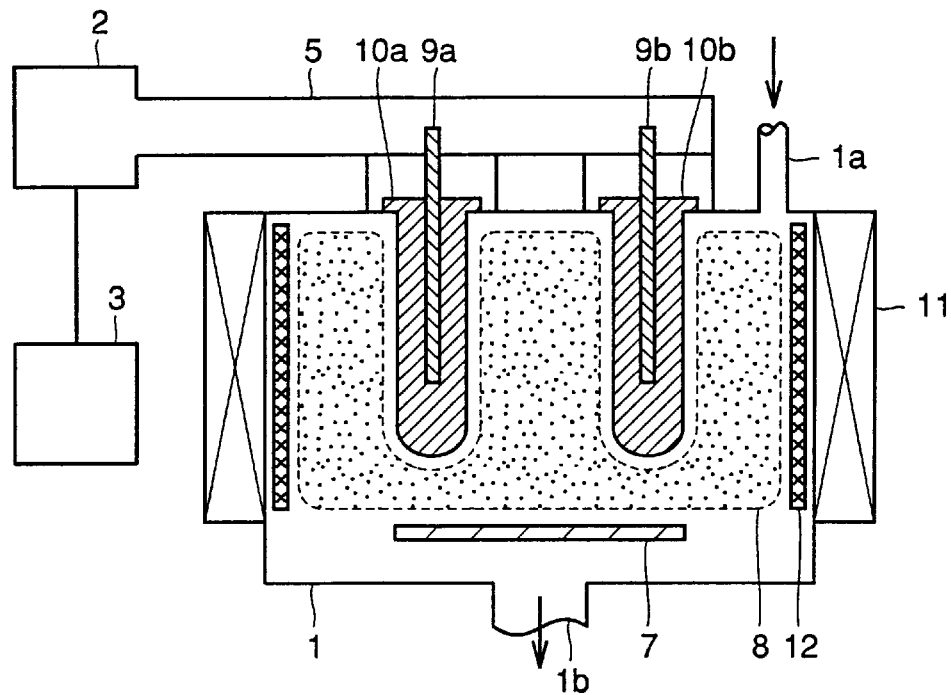
FIG. 7 shows a schematic structure of one variation of the plasma generating apparatus according to the first embodiment of the present invention.

Although rod antennas 9a, 9b, 9c, 9d, are used to emit microwaves from the microwave transmission circuit in this embodiment, any antenna structure which can emit microwaves such as a spiral antenna as shown in FIG. 4, a helical antenna as shown in FIG. 5, a lisitano coil as shown in FIG. 6 and a loop antenna (not shown) can also have the effect that the uniformity of plasma is improved. Further, the effect that the uniformity of plasma is improved can also be achieved even by combining the antenna structures as necessary.

Although the number of rod antennas 9a, 9b, 9c, 9d and dielectric tubes 10a, 10b, 10c, 10d for introducing microwaves is 4 as an example in this embodiment, the number does not need to be 4. By introducing microwaves from at least more than one location, the uniformity of plasma can be improved.

Figure 8:
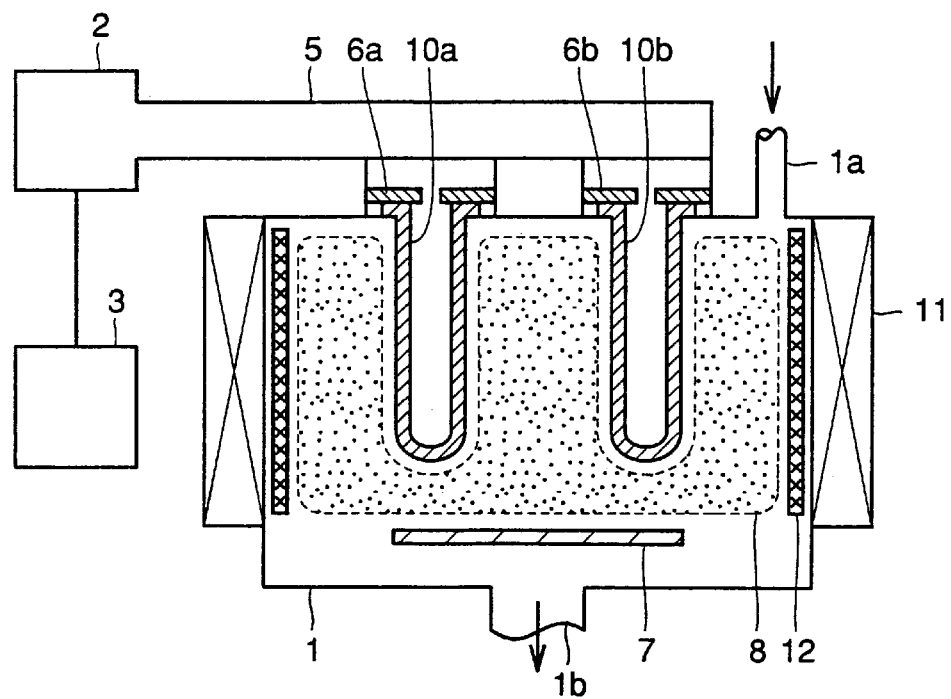
FIG. 8 shows a schematic structure of another variation of the plasma generating apparatus according to the first embodiment of the present invention.
Figure 9:
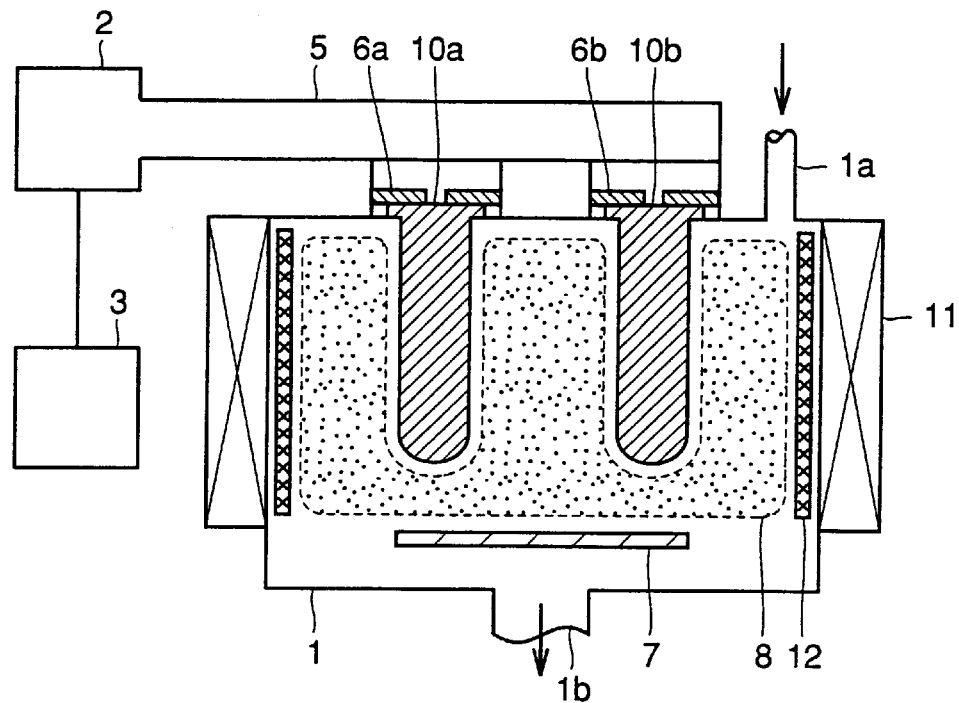
FIG. 9 shows a schematic structure of still another variation of the plasma generating apparatus according to the first embodiment of the present invention.

Although dielectric tubes are used in this embodiment, dielectric rods 10a, 10b, 10c, 10d having antennas 9a, 9b, 9c, 9d buried into a dielectric may be employed. Even when antennas 9a, 9b, 9c, 9d as microwave emitting means are not used and dielectric tubes or dielectric rods 10a, 10b, 10c, 10d are provided under slits and connected to the waveguide as shown in FIGS. 8 and 9, the uniformity of plasma 8 can also be improved.

Although permanent magnets 11 are used to generate, as multi-cusp magnetic field 13, a line-cusp magnetic field as shown in FIG. 3 in this embodiment, any distribution of magnetic field strength forming a strong magnetic field region in the vicinity of a wall surface of vacuum vessel 1 and forming a low magnetic field region at the center of vacuum vessel 1 to which microwaves are introduced, such as a ring-cusp magnetic field or a compound-cusp magnetic field, can achieve the same effect.

Although waveguide 5 and branch portions 20a, 20b, 20c are provided as means for supplying power from microwave oscillator 2 in this embodiment, the same effect can be achieved even by using a coaxial cable or a corrugated tube instead.

Further, the structure capable of achieving the same effect can be realized even by combining the waveguide, the coaxial cable, the corrugated tube as necessary.

(Second Embodiment)

A second embodiment of the present invention will be described below with reference to FIGS. 10–13.

Figure 10:
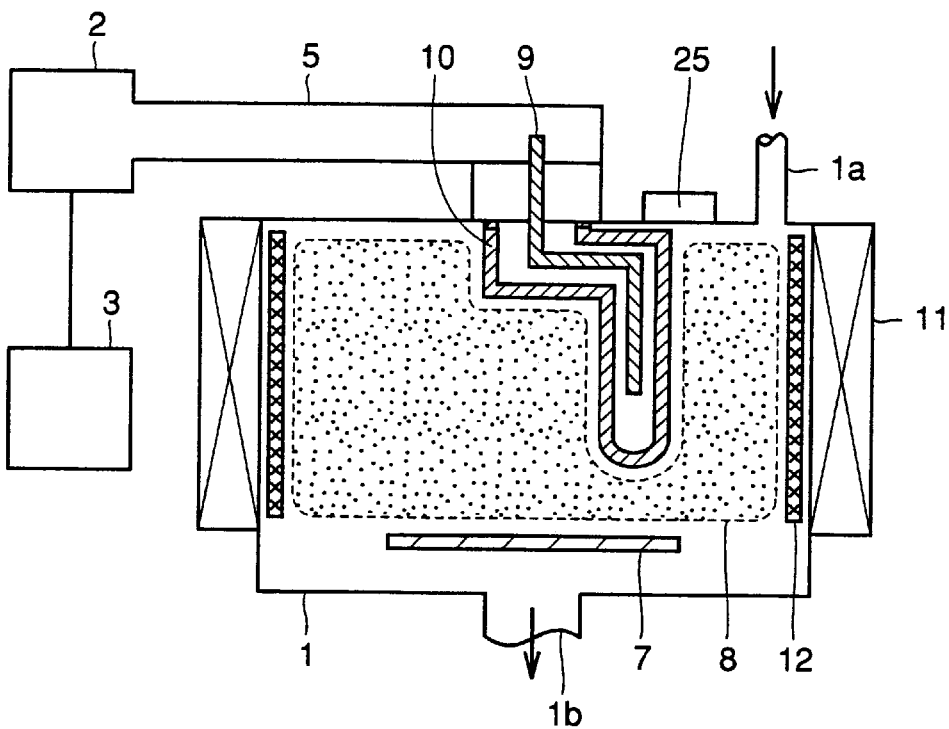
FIG. 10 shows a schematic structure of a plasma generating apparatus according to a second embodiment of the present invention.

As shown in FIG. 10, the plasma generating apparatus includes vacuum vessel 1, microwave oscillator 2, driving power supply 3 and waveguide 5. Further, vacuum vessel 1 has gas supply port 1a for supplying a discharge gas and gas evacuation port 1b for evacuating the discharge gas inside the vessel. Substrate 7 to be processed is placed on a lower side of the interior vacuum vessel 1. On an upper side of vacuum vessel 1 is provided with a driving device 25 capable of rotating, in vacuum vessel 1, one rod antenna 9 and dielectric tube 10 into which one end of rod antenna 9 inserted. The upper end of dielectric tube 10 is connected to one end of waveguide 5, and the other end of waveguide 5 is connected to microwave oscillator 2 supplied with power from driving power supply 3.

Permanent magnets 11 are located around vacuum vessel 1. Permanent magnets 11 generate cyclotron resonance region 12 where magnetic strength is about 875 G for microwaves having a frequency of 2.45 GHz, for example, in a magnetic region where the frequency of microwaves coincides with the cyclotron frequency of electrons. Permanent magnets 11 also generate multi-cusp magnetic field 13 and equal magnetic field strength lines 14. Rod antenna 9 and dielectric tube 10 for introducing microwaves into vacuum vessel 1 are located inside vacuum vessel 1, and magnetic strength at the microwave introduction portion is within 100 G as shown in FIG. 3. In this structure, plasma 8 is produced in vacuum vessel 1. Rod antenna 9 emits microwaves from the microwave transmission circuit. Dielectric tube 10 is made of quartz, they separate the vacuum atmosphere from the atmosphere, and can pass microwaves to be introduced into vacuum vessel 1.

Figure 11:
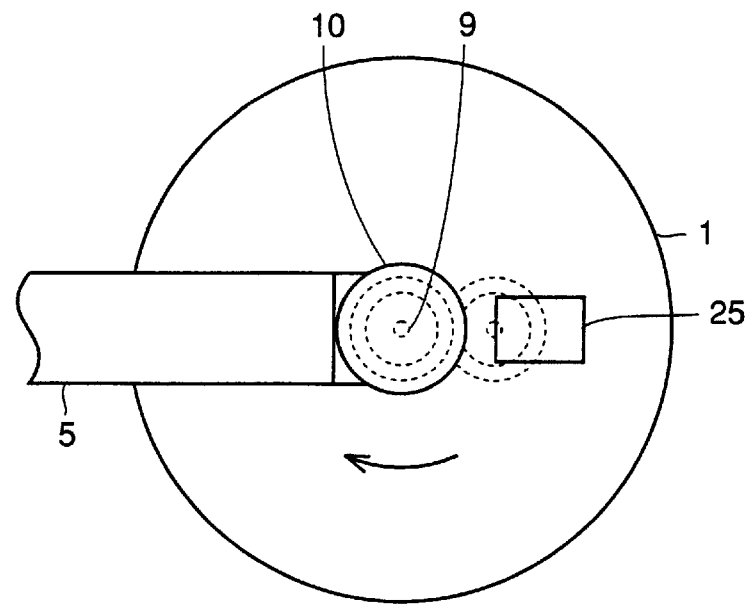
FIG. 11 is a plan view in the neighborhood of a vacuum vessel of the plasma generating apparatus shown in FIG. 10.

Since the operation of the plasma generating apparatus in this embodiment is almost the same as the plasma generating apparatus in the first embodiment until the microwaves are guided to rod antenna 9 and dielectric tube 10, the description will not be repeated. After the microwaves are guided to rod antenna 9 and dielectric tube 10, the microwaves are introduced from dielectric tube 10 into vacuum vessel 1 as in the first embodiment. At this time, however, dielectric tube 10 is rotated in vacuum vessel 1 by driving device 25 as shown in FIGS. 10 and 11. Therefore, the microwave introduction portion rotates in vacuum vessel 1 and accordingly the plasma generation portion rotates. In a conventional plasma generating apparatus, rod antenna 109 and dielectric tube 110 are provided to introduce microwave power from one fixed location to vacuum vessel 101 as shown in FIG. 22. In this embodiment, however, one rod antenna 9 and dielectric tube 10 capable of rotating are introduced in a low magnetic field region in vacuum vessel 1. Therefore, the microwave generation portion moves with the passage of time. Thus, the microwaves are controlled in a time-divisional manner and uniformly supplied not only in the height direction but in the diameter direction. Therefore, the uniformity of the plasma density is improved, suppressing decrease of the plasma density which is caused by recombination of electrons and ions in plasma 8 dispersing in the diameter direction. Since the uniformity of plasma 8 in vacuum vessel 1 is improved in this embodiment, an uniform processing can be performed for substrate 7 provided in vacuum vessel 1. When a semiconductor device is provided on substrate 7 and subjected to a film formation processing by the plasma CVD method, for example, an uniform plasma distribution is available. Thus, improvement in yield can be expected.

(Third Embodiment)

A third embodiment of the present invention will be described below with reference to FIGS. 12–20.

Figure 12:
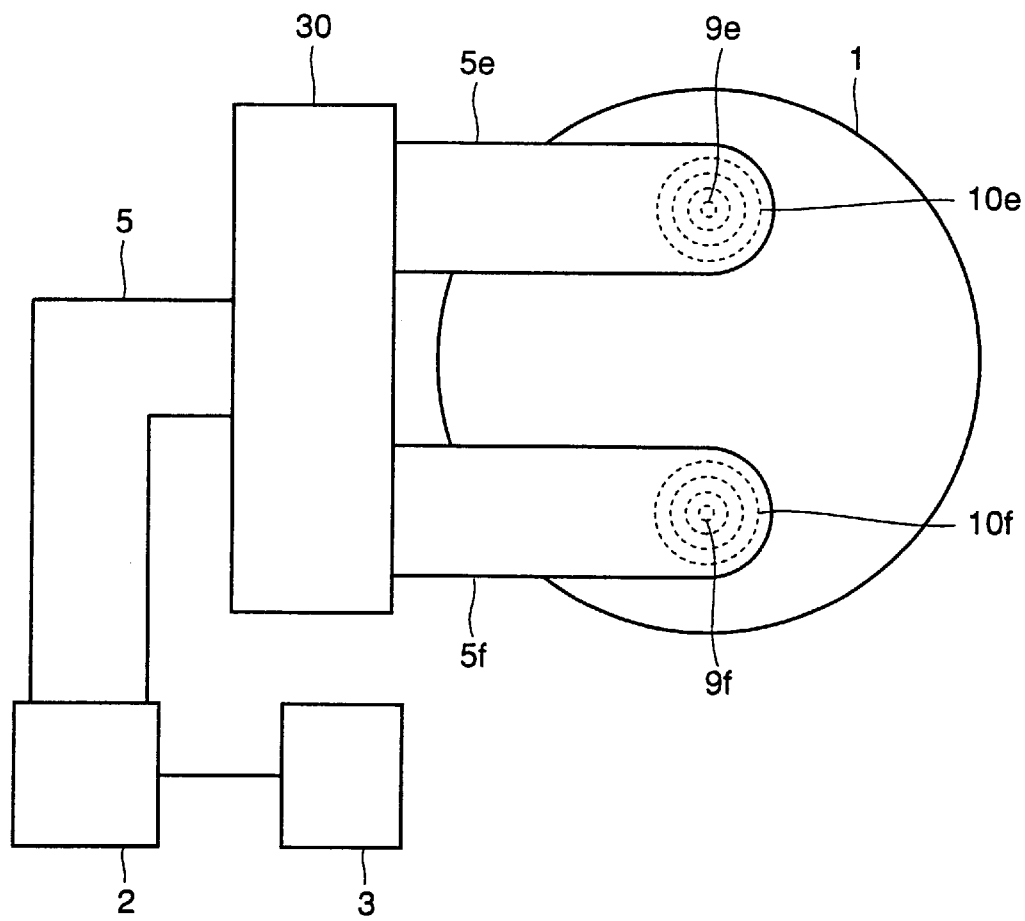
FIG. 12 is a plan view showing an overall schematic structure of a plasma generating apparatus according to a third embodiment of the present invention.

As shown in FIG. 12, a device for controlling supply of microwave power in the plasma generating apparatus according to this embodiment has a branching unit 30 which is connected to waveguide 5 and has means for distributing the microwave power. Branching unit 30 is connected to waveguides 5e and 5f and it supplies the microwave power to rod antennas 9e and 9f. Rod antennas 9e and 9f are connected to waveguides 5e and 5f, and they emit the microwave power from the microwave transmission circuit. The microwave power emitted from rod antennas 9e and 9f pass through dielectric tubes 10e and 10f. Dielectric tubes 10e and 10f are made of quartz, they separate the vacuum atmosphere from the atmosphere, and can pass microwaves to be introduced into vacuum vessel 1.

Figure 13:
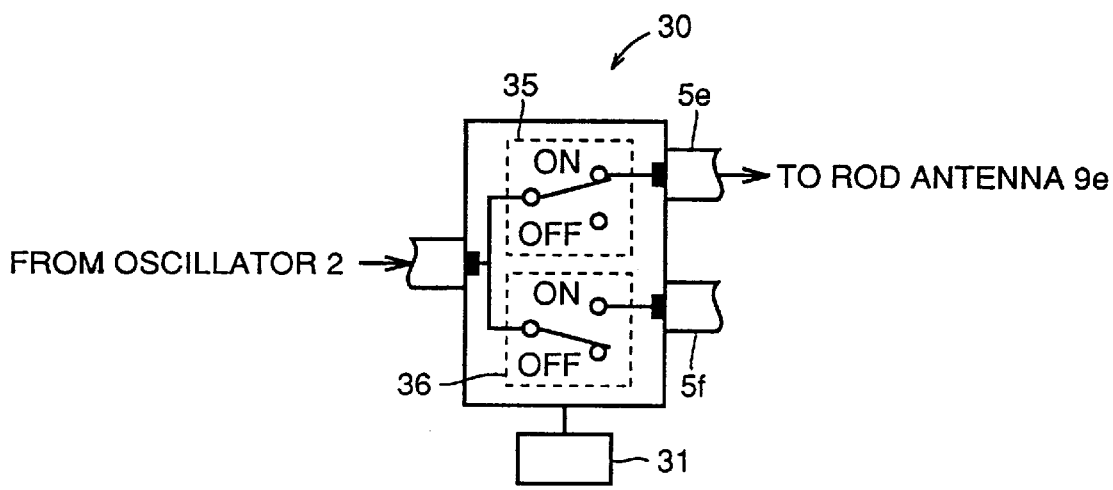
FIG. 13 is a schematic diagram of distributor 30 when switches 35 and 36 are ON and OFF, respectively, in the third embodiment of the present invention.
Figure 14:
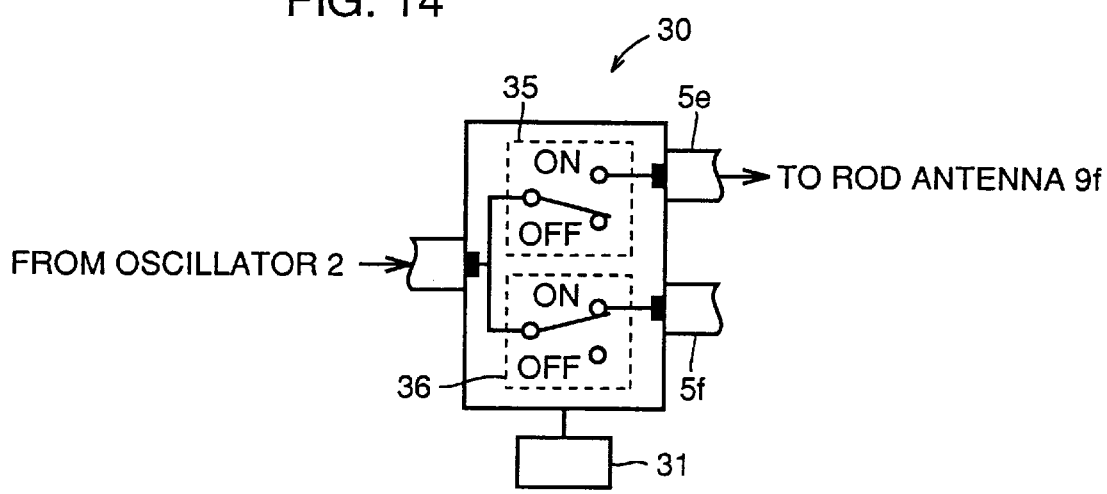
FIG. 14 is a schematic diagram of distributor 30 when switches 35 and 36 are OFF and ON, respectively, in the third embodiment of the present invention.
Figure 15:
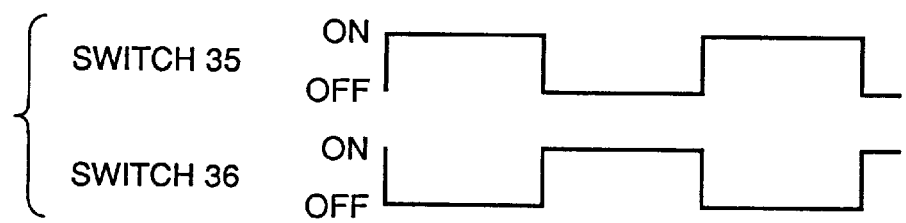
FIG. 15 shows pulses for controlling switches 35 and 36 of distributor 30 in the third embodiment of the present invention.
Figure 16:
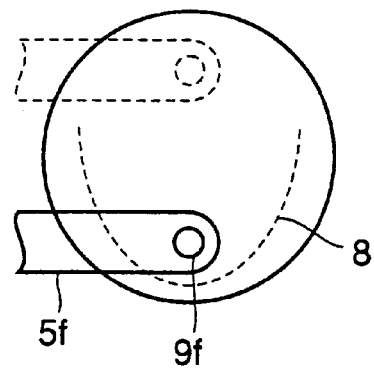
FIG. 16 shows plasma generation when switches 35 and 36 of distributor 30 are OFF and ON, respectively, in the third embodiment of the present invention.

FIGS. 13 and 14 schematically show branching unit 30 described in connection with the method for supplying microwave power in this embodiment. In branching unit 30, switches 35 and 36 are provided which are switching means for turning ON/OFF supply of the microwave power. Further, a controller 31 is provided being connected to branching unit 30, and it controls ON/OFF of switches 35 and 36 provided in branching unit 30 with the waveform for switching operation as shown in FIG. 15. FIGS. 16 an 17 show the relation between the operation of branching unit 30 in FIGS. 13 and 14 and the generated plasma.

The operation of the thus structured plasma generating apparatus in this embodiment will be described below. Since the method for generating and maintaining plasma is the same as the first embodiment, the description will not be repeated. Here, the method for supplying microwave power to vacuum vessel 1 will be described.

Figure 18:
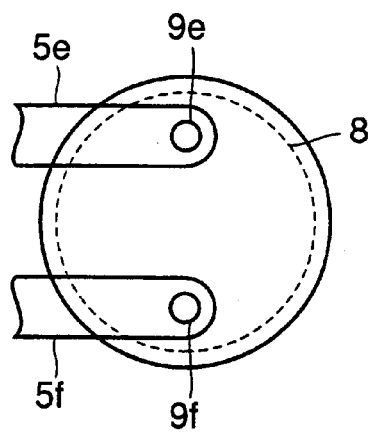
FIG. 18 shows plasma generation when switches 35 and 36 of the distributor are both ON in the third embodiment of the present invention.

From microwave oscillator 2, the microwave power is guided through waveguide 5 to branching unit 30. The microwave power guided to branching unit 30 is distributed into two directions when controller 31 turns ON switches 35 and 36 in branching unit 30. The microwave power which is distributed into two directions is introduced through waveguides 5e and 5f connected to branching unit 30 and through rod antennas 9e and 9f connected to waveguides 5e and 5f into vacuum vessel 1. Thus, the plasma as shown in FIG. 18 is generated.

Although branching unit 30 distributes the microwave power into two directions in this embodiment, the number of directions for distribution can be changed as necessary by using a branching unit which distributes the microwave power into an arbitrary number of directions such as three directions or four directions.

Although waveguides 5, 5e, 5f are used as means for supplying power from microwave oscillator 2 in this embodiment, a coaxial cable or a corrugated tube can be used to distribute microwaves. Microwaves can also be distributed even by combining waveguide 5 with the coaxial cable and the corrugated tube as necessary.

Figure 17:
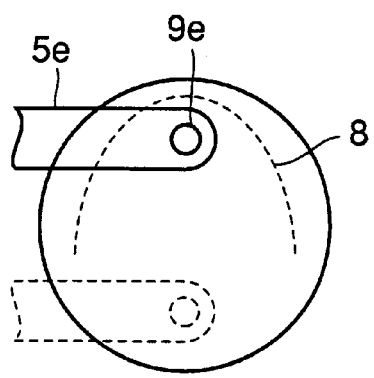
FIG. 17 shows plasma generation when switches 35 and 36 of distributor 30 are ON and OFF, respectively, in the third embodiment of the present invention.

In this embodiment, the microwave power is simultaneously distributed and supplied from branching unit 30 to waveguides 5e and 5f. However, the location for oscillating the microwave power can be switched as necessary by controlling switches 35 and 36 in branching unit 30, as necessary, using controller 31 as shown in FIGS. 16–18 with the waveform for switching operation as shown in FIG. 15. Further, by alternately switching between switches 35 and 36 as shown in FIGS. 13 and 14, plasma 8 generated in vacuum vessel 1 is alternately generated in the periphery of rod antennas 9e and 9f as shown in FIGS. 16 and 17. Therefore, plasma 8 is formed which is not uniform for an instant but is uniform within a constant unit time. Further, power per rod antenna can be increased compared with a case in which two rod antennas 9e and 9f are simultaneously discharged. As a result, energy for introducing the microwave power per dielectric tube can be increased when antennas are alternately discharged in a time-divisional manner if a power supply with the same power is used. Thus, plasma of higher density can be generated when strong energy of microwaves is alternately generated at one location in a time-divisional manner than when weak energy of microwaves is simultaneously introduced to two locations.

In this embodiment, a polar contact method of a relay type has been described as switches 35 and 36 in branching unit 30. By using a contactless method such as a stub type, plasma of high density can also be generated in a time-divisional manner. Although one microwave oscillator 2 is used together with branching unit 30 for distribution and supplying in this embodiment, a microwave oscillator and a waveguide is connected to each one of a plurality of waveguides connected to a vacuum vessel.

Figure 19:
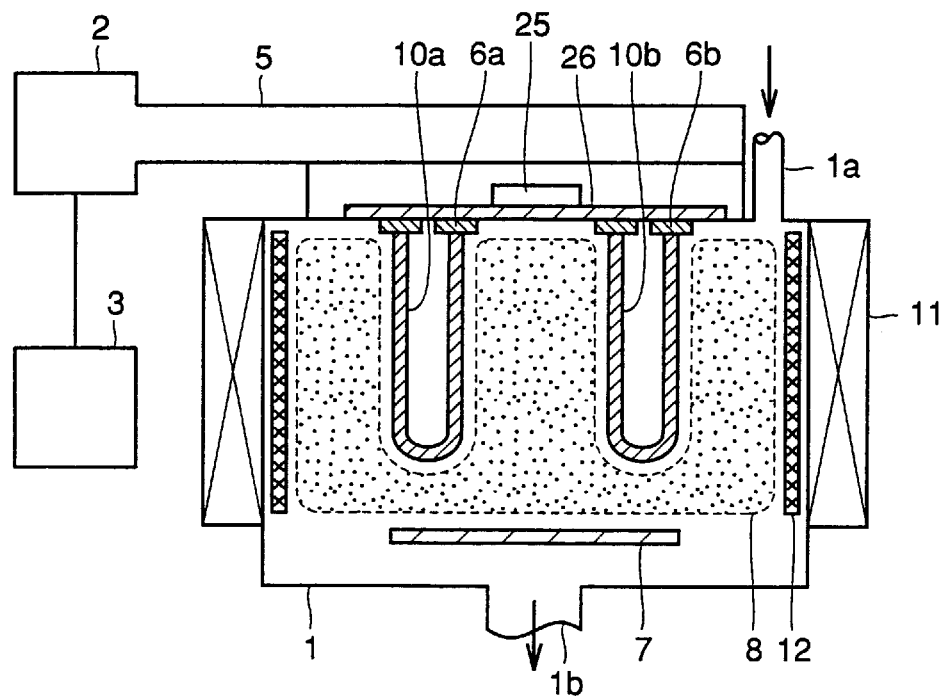
FIG. 19 shows a schematic structure of one variation of the plasma generating apparatus according to the third embodiment of the present invention.
Figure 20:
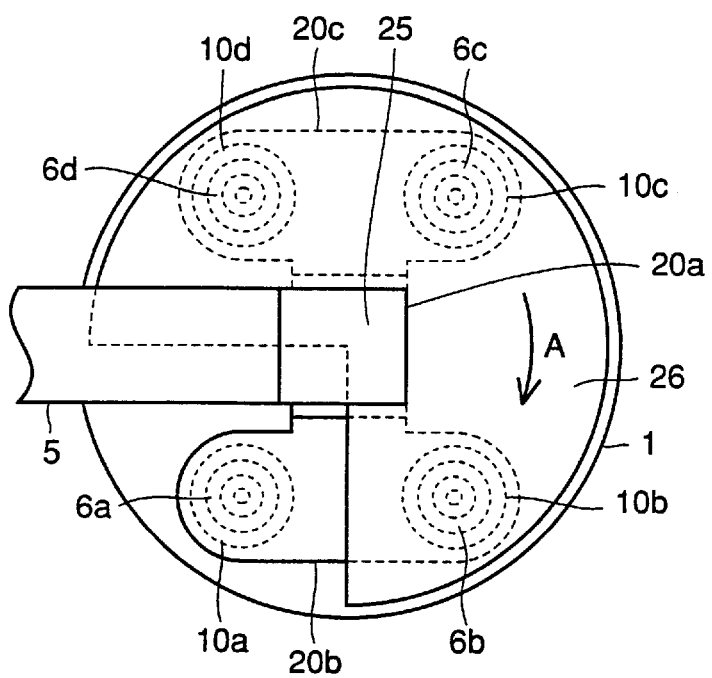
FIG. 20 is a plan view in the neighborhood of a vacuum vessel of the plasma generating apparatus shown in FIG. 19.
Figure 21:
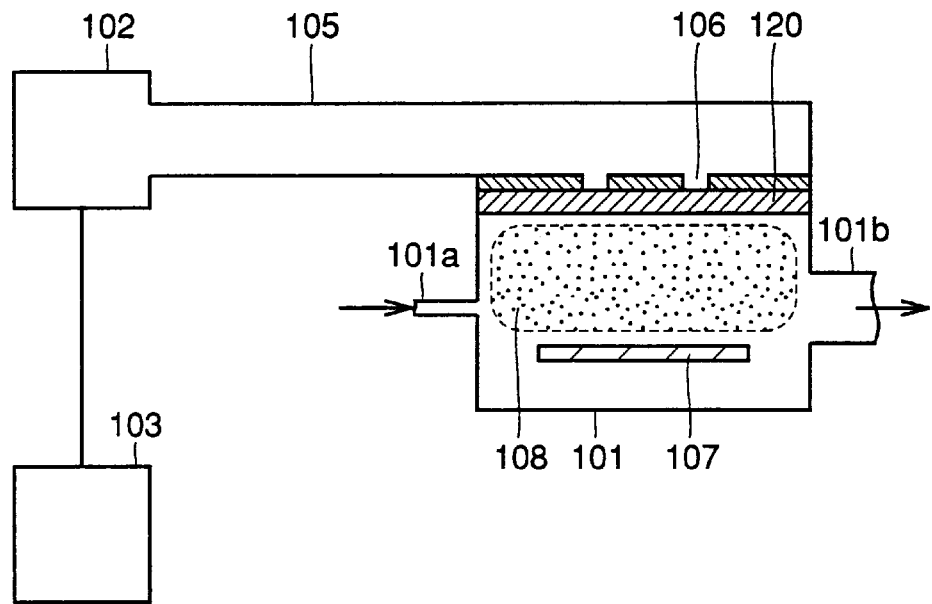
FIG. 21 shows a schematic structure of a conventional plasma generating apparatus.

In this embodiment, microwaves are distributed by using a T branch and an antenna. However, in order to distribute microwaves, a plurality of slits and corresponding dielectric members may be fixed, and the slits may be controlled so that they are opened successively in a time-divisional manner by a shutter. Plasma of high density can also be generated in this manner. An example of such a variation is shown in FIGS. 19 and 20. Slits 6a, 6b, 6c, 6d are provided above dielectric tubes 10a, 10b, 10c, 10d, and a shutter 26 for opening only one of slits 6a, 6b, 6c, 6d and closing others is provided on the upper surface of vacuum vessel 1. Slits 6a, 6b, 6c, 6d are successively opened by rotating shutter 26 in the direction denoted by arrow A in FIG. 20.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma generating apparatus for generating plasma in a prescribed region including a plasma processing region, comprising:
    a vacuum vessel having said plasma processing region therein and equipped with a vacuum evacuation means;
    a discharge gas supplying means for supplying a discharge gas into said vacuum vessel;
    a microwave emitting means for emitting microwaves into said vacuum vessel;
    a microwave introducing means for introducing microwaves emitted by said microwave emitting means into said vacuum vessel; and
    a magnetic field generating means for generating a magnetic field in said vacuum vessel;
    wherein said microwave introducing means includes a plurality of tube-shaped or rod-shaped dielectric members arranged in parallel and inserted into said vacuum vessel; and
    said magnetic field generating means includes a means for generating a magnetic field strong enough for creating an electron cyclotron resonance region with microwaves having a prescribed frequency in the vicinity of an inner wall of said vacuum vessel and a means for generating a magnetic field of less than or equal to 100 G in the region where said plurality of tube-shaped or rod-shaped dielectric members of said microwave introducing means are located.

2. The plasma generating apparatus according to claim 1, wherein
    said microwave emitting means has a plurality of antennas each having one end coupled to said microwave transmitting means and another end inserted into each said dielectric member.

3. The plasma generating apparatus according to claim 1, wherein
    said microwave emitting means includes a slit which is opened near said one end of said dielectric member.

4. The plasma generating apparatus according to claim 1, further comprising:
    driving means for moving, in said vacuum vessel, a portion of said microwave emitting means for emitting the microwaves into said vacuum vessel and said microwave introducing means.

5. The plasma generating apparatus according to claim 1, wherein
    said microwave transmitting means has microwave distributing means for distributing the microwaves generated from said microwave generating means to supply power to said microwave emitting means.

6. The plasma generating apparatus according to claim 1, wherein
    said microwave emitting means includes means for successively and selectively switching a location for emitting the microwaves among said plurality of locations.

7. The plasma generating apparatus according to claim 6, wherein
    said microwave transmitting means has microwave distributing means for distributing the microwaves generated from said microwave generating means to supply power to a plurality of said microwave emitting means, and said microwave distributing means includes switching means for switching microwave emitting means to be supplied with the microwaves among the plurality of said microwave emitting means.

8. The plasma generating apparatus according to claim 6, wherein
    said microwave emitting means includes a plurality of slits being opened near one end of said microwave introducing means and a shutter for selectively shutting the plurality of slits to switch a slit for emitting the microwaves among said plurality of slits.

* * * * *